United States Patent

Hörold et al.

Patent Number: 5,854,361
Date of Patent: Dec. 29, 1998

[54] PROCESS FOR PREPARING PHOSPHORUS-MODIFIED EPOXY RESINS

[75] Inventors: Sebastian Hörold, Erftstadt; Hans-Peter Schmitz, Brühl, both of Germany

[73] Assignee: Hoechst Aktiengesellschaft, Frankfurt, Germany

[21] Appl. No.: 827,433

[22] Filed: Mar. 27, 1997

[30] Foreign Application Priority Data

Apr. 1, 1996 [DE] Germany ......... 196 13 066.2

[51] Int. Cl.⁶ ............... C08G 59/16; C08K 5/07
[52] U.S. Cl. ........... 525/533; 523/454; 523/455; 523/456; 525/508; 525/528; 528/108
[58] Field of Search ............... 528/108; 525/508, 525/533, 528; 523/454, 455, 456

[56] References Cited

U.S. PATENT DOCUMENTS

| | | |
|---|---|---|
| 3,236,863 | 2/1966 | Smith . |
| 3,334,110 | 8/1967 | Schramm ............... 260/307 |
| 3,477,982 | 11/1969 | Dijkstra et al. ............ 260/37 |
| 4,272,647 | 6/1981 | Veit et al. ............ 179/1 AL |
| 4,289,812 | 9/1981 | Martin ............... 427/379 |
| 5,294,265 | 3/1994 | Gray et al. ............ 148/250 |
| 5,364,893 | 11/1994 | von Gentzkow et al. ...... 523/429 |
| 5,648,171 | 7/1997 | Von Gentzkow et al. ...... 528/108 |

FOREIGN PATENT DOCUMENTS

| | | |
|---|---|---|
| 0384939 | 9/1990 | European Pat. Off. . |
| 1745796 | 3/1972 | Germany . |
| 2518144 | 11/1976 | Germany . |
| 2540283 | 3/1977 | Germany . |
| 2757733 | 7/1978 | Germany . |
| 29 20 718 | 11/1979 | Germany . |
| 3540524 | 5/1987 | Germany . |
| 6-80765 | 3/1994 | Japan ............... 528/108 |
| 688504 | 11/1979 | U.S.S.R. . |
| 1031369 | 6/1966 | United Kingdom . |
| 1517865 | 7/1978 | United Kingdom . |

OTHER PUBLICATIONS

*Lackkunstharze* (Wagner/Sarx), 5th ed., Carl Hanser Verlag (1971), pp. 174–194.

Bald, G., et al, *Angewandte Makromol. Chem.* 44:151–163 (1975).

*Primary Examiner*—Robert E. Sellers
*Attorney, Agent, or Firm*—Miles B. Dearth

[57] ABSTRACT

The invention relates to a process for preparing soluble and/or meltable phosphorus-modified epoxy resins, which comprises reacting a polyepoxide compound having at least 2 epoxide groups per molecule with carboxyl-containing phosphinic or phosphonic acids.

14 Claims, No Drawings

PROCESS FOR PREPARING PHOSPHORUS-MODIFIED EPOXY RESINS

The present invention relates to a process for preparing phosphorus-modified epoxy resins.

Epoxy resins are nowadays employed for producing molding compositions and coatings having good thermal, mechanical and electronic properties. They are suitable for encapsulating electrical and electronic components and for soak and impregnation processes. In electrical engineering, the epoxy resin molding compositions used are predominantly given a flame-resistant treatment.

Epoxy resin molding compositions are generally given a flame-resistant treatment using bromine-containing aromatic compounds, especially tetrabromobisphenol A. Where exclusively brominated flameproofing agents are employed, a bromine content of about 20% is required in order to ensure that the molding compositions are self-extinguishing. As a synergist, antimony trioxide is frequently used. In the event of fire, hydrogen bromide is given off, which can lead to corrosion damage. Under adverse conditions, it is also possible for polybrominated dibenzodioxins and furans to be formed. There is therefore a need for epoxy resin molding compositions which achieve the required flame resistance without the addition of brominated compounds.

For the flame-resistant treatment of epoxy resin molding compositions, fillers having an extinguishing effect, such as aluminum oxide hydrate (DE 35 40 524 A1), have been proposed. In addition, by adding ammonium polyphosphate, alone or in combination with aluminum oxide hydrate, it is possible to obtain adequate flame resistance. Instead of ammonium polyphosphate, red phosphorus can also be used (DE 17 45 796 A1).

A disadvantage with all of the flameproofing agents present as filler is that the materials obtained are not transparent. Numerous liquid organophosphorus compounds have already been proposed as flame-retarding plastics additives. A disadvantage with these systems, however, is the pronounced "plasticizer effect" of these additives. In the case of cured epoxy resins, the plasticizing effect is manifested in a sharp reduction in the glass transition temperature.

The flame-resistant treatment of epoxy resins with epoxide-functional phosphonic esters has already been described (EP 0 384 939 A1). A disadvantage with these systems is the high complexity of synthesis of such phosphonic esters. Also known in the literature are phosphorus-modified epoxy resins which are obtainable by reacting polyepoxide compounds with anhydrides of phosphonic acids or phosphinic acids and are notable for good flame-resistant properties (DE 43 08 185 A1). Easier to obtain industrially than the anhydrides are carboxy-functional phosphonic and phosphinic acids. Products of this kind are already being used for the flame-resistant treatment of polyester fibers (U.S. Pat. No. 5,399,428 A1).

The object of the invention was to provide a process for preparing phosphorus-modified epoxy resins which would allow the desired products to be prepared simply and inexpensively.

This object is achieved by a process of the type described at the outset which comprises reacting a polyepoxide compound having at least 2 epoxide groups per molecule with carboxyl-containing phosphinic or phosphonic acids.

The phosphorus compounds used in accordance with the invention are derived from phosphinic acids of the formula I or, respectively, from phosphonic acids of the formula II

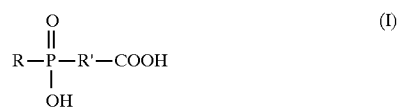

in which R is linear or branched alkyl, cycloalkyl, aryl or alkylaryl groups having 1 to 18, preferably 1 to 6 carbon atoms and R' is linear or branched alkylene, cycloalkylene, arylene or alkylarylene groups having 1 to 18, preferably 1 to 6 carbon atoms and, with particular preference 1–2 carbon atoms.

The phosphinic acids are preferably 2-carboxyethanemethanephosphinic acid, 2-carboxyethanephenylphosphinic acid or 2-carboxymethylmethanephosphinic acid.

The phosphonic acids are preferably monomethyl 2-carboxyethanephosphonate, 2-carboxyethanephosphonic acid or monoethyl carboxymethylphosphonate.

The reaction preferably takes place in a solvent.

Preference is given to the use of aprotic polar solvents such as N-methylpyrrolidone, dimethylformamide, tetrahydrofuran, dioxane, dialkyl ethers, glycol ethers, ketones and/or esters.

Other preferred solvents employed are halogenated hydro-carbons, aliphatic, cycloaliphatic and/or aromatic hydro-carbons, individually or as mixtures.

The reaction preferably take; place at temperatures from 20° to 150° C.

The ratio of equivalents between polyepoxide compound and carboxyl-containing phosphinic and/or phosphonic acid is preferably from 1:0.1 to 1:0.8.

The phosphorus-modified epoxy resins obtained by the novel process are suitable for producing moldings, coatings or laminates.

The invention likewise relates to moldings, coatings or laminates produced using the phosphorus-modified epoxy resin obtained by the novel process.

The carboxy-functional phosphinic acids and phosphonic acids on which the invention is based can be prepared, for example, by addition reaction of suitable phosphorus compounds with acrylic acid or acrylic esters.

The phosphorus compound can preferably be methanephosphonous dichloride. Addition reaction with acrylic acid and subsequent hydrolysis gives carboxy ethylmethylphosphinic acid (III) (DE 25 40 283 A1). Similarly, phenylphosphonous dichloride can also be used.

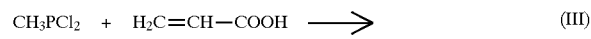

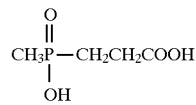

The carboxy-functional phosphonic acids can be prepared, for example, by addition reaction of dialkyl or diaryl phosphites with acrylic esters and subsequent partial or complete hydrolysis (IV) (DE 25 18 144 A1).

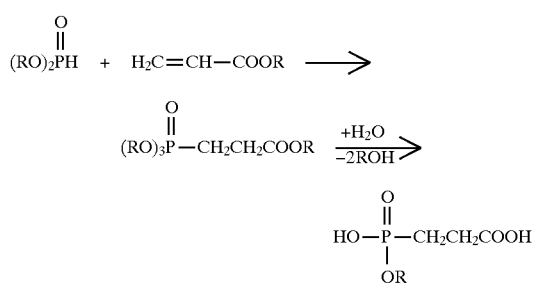

(IV)

The carboxy-functional phosphonic acids can also be obtained from phosphonous triesters and halo-substituted acetals, in the manner of the Arbuzov reaction, and subsequent hydrolysis (V).

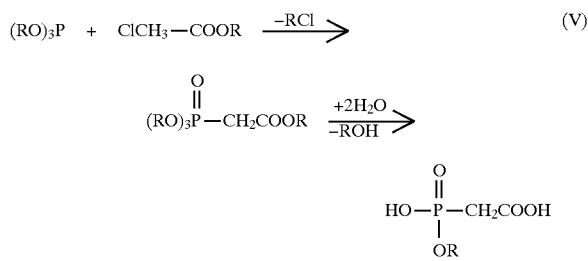

(V)

The halogen-free epoxide compounds employed in accordance with the invention (also referred to below as polyepoxide compounds) can be saturated or unsaturated and can be aliphatic, cycloaliphatic, aromatic and/or heterocyclic. They may, furthermore, include substituents which do not give rise, under the conditions of mixing or of reaction, to disruptive side reactions, examples being alkyl or aryl substituents, ether groups or the like. It is also possible to use mixtures of different polyepoxide compounds. The mean molecular weight $M_n$ of these polyepoxide compounds can be up to about 9000, but is generally from about 150 to 4000.

These polyepoxide compounds are, for example, polyglycidyl ethers based on polyhydric, preferably dihydric, alcohols, phenols, hydrogenation products of these phenols and/or on novolaks (reaction products of mono- or polyhydric phenols, such as phenol and/or cresols, with aldehydes, especially formaldehyde, in the presence of acidic catalysts), which are obtained in the known manner, for example by reacting the respective polyols with epichlorohydrin.

Examples of polyhydric phenols which may be mentioned here are: resorcinol, hydroquinone, 2,2-bis(4-hydroxyphenyl)propane (bisphenol A), isomer mixtures of dihydroxydiphenylmethane (bisphenol F), 4,4'-dihydroxydiphenylcyclohexane, 4,4'-dihydroxy-3,3'-dimethyldiphenylpropane, 4,4'-dihydroxybiphenyl, 4,4'-dihydroxybenzophenone, 1,1-bis(4-hydroxyphenyl)ethane, 1,1'-bis(4-hydroxyphenyl)isobutane, 2,2-bis(4-hydroxy-tert-butylphenyl)propane, bis(2-hydroxynaphthyl)methane, 1,5-dihydroxynaphthalene, tris(4-hydroxyphenyl)methane, 1,1'-bis(4-hydroxyphenyl)ether. Bisphenol A and bisphenol F are preferred in this context.

The polyglycidyl ethers of polyhydric aliphatic alcohols are also suitable as polyepoxide compound. Examples of such polyhydric alcohols that may be mentioned are 1,4-butanediol, 1,6-hexanediol, polyalkylene glycols, glycerol, trimethylolpropane, 2,2-bis(4-hydroxycyclo-hexyl)propane and pentaerythritol.

Other suitable polyepoxide compounds are (poly)glycidyl esters, which are obtained by reacting epichlorohydrin or similar epoxy compounds with an aliphatic, cycloaliphatic or aromatic polycarboxylic acid such as oxalic acid, adipic acid, glutaric acid, phthalic, isophthalic, terephthalic, tetrahydrophthalic or hexahydrophthalic acid, 2,6-naphthalenedicarboxylic acid and dimerized fatty acids. Examples thereof are glycidyl terephthalate and diglycidyl hexahydrophthalate.

Polyepoxide compounds which comprise the epoxide groups in random distribution along the molecule chain and which can be prepared by emulsion copolymerization using olefinically unsaturated compounds containing these epoxide groups, for example glycidyl esters of acrylic or methacrylic acid, can also be employed with advantage in some cases.

Examples of further polyepoxide compounds which can be used are those based on heterocyclic ring systems, such as, for example hydantoin epoxy resins, triglycidyl isocyanurate and/or its oligomers, triglycidyl-p-amino-phenol, triglycidyl-p-aminodiphenyl ether, tetraglycidyldiaminodiphenylmethane, tetraglycidyldiaminodiphenyl ether, tetrakis(4-glycidyloxyphenyl)ethane, urazole epoxides, uracil epoxides, oxazolidinone-modified epoxy resins. Furthermore polyepoxides based on aromatic amines, such as aniline, for example N,N-diglycidylaniline, diaminodiphenylmethane and N,N'-dimethylaminodiphenylmethane or N,N'-dimethylaminodiphenyl sulfone. Further suitable polyepoxide compounds are described in the "Handbook of Epoxy Resins" by Henry Lee and Kris Neville, McGraw-Hill Book Company, 1967, in the monograph by Henry Lee "Epoxy Resins", American Chemical Society, 1970, in Wagner/Sarx, "Lackkunstharze", Carl Hanser Verlag (1971), 5th edition, 174 ff., in "Angew. Makromol. Chemie", Vol. 44 (1975), pages 151 to 163, in DE 27 57 733 A1 and in EP 0 384 939 A1, which are incorporated herein by reference.

Polyepoxide compounds preferably employed are bisglycidyl ethers based on bisphenol A, bisphenol F and bisphenol S (reaction products of these bisphenols and epichloro(halo)hydrin) or oligomers thereof, polyglycidyl ethers of phenol-formaldehyde and/or cresol-formaldehyde novolaks, and also diglycidyl esters of phthalic, isophthalic, terephthalic, tetrahydrophthalic and/or hexahydrophthalic acid and also of trimellitic acid, N-glycidyl compounds of aromatic amines and heterocyclic nitrogen bases, such as N,N-diglycidylaniline, N,N, O-triglycidyl-p-aminophenol, triglycidyl isocyanurate and N,N,N',N'-tetraglycidylbis(p-aminophenyl)methane, hydantoin epoxy resins and aracid epoxy resins, and also di- and polyglycidyl compounds of polyhydric aliphatic alcohols, such as 1,4-butanediol, trimethylolpropane and polyalkylene glycols.

In addition, oxazolidinone-modified epoxy resins are also suitable. Such compounds are already known (see: "Angew. Makromol. Chem.", vol. 44 (1975), pages 151 to 163, and also U.S. Pat. No. 3,334,110); an example thereof which may be mentioned is the reaction product of bisphenol A diglycidyl ether with diphenylmethane diisocyanate (in the presence of an appropriate accelerator). In connection with the preparation of the novel coating composition, the polyepoxy resins can be present individually or in a mixture.

The term "curing" as used herein denotes the conversion of the soluble, meltable polyepoxides to solid, insoluble and infusible, three-dimensionally crosslinked products, generally with simultaneous shaping, to give, for instance, impregnated structures, coatings and adhesive bonds.

Examples of hardeners (curing agents) which can be employed are aliphatic, cycloaliphatic, aromatic and heterocyclic amines, such as bis(4-aminophenyl)methane, aniline-formaldehyde resins, bis(4-aminophenyl)sulfone, ethylenediamine, 1,3-propanediamine, hexamethylenediamine, diethylenetriamine, triethylenetetramine, 2,2,4-trimethyl-1,6-hexanediamine, m-xylylenediamine, bis(4-aminocyclohexyl)methane, 2,2-bis(4-aminocyclohexyl)propane, 3-aminomethyl-3,5,5-trimethylcyclohexylamine (isophoronediamine), polyamidoamines, polyphenols, such as hydroquinone, resorcinol, 2,2-bis(4-hydroxyphenyl)propane (bisphenol A) and phenol-aldehyde resins, polycarboxylic acids and their anhydrides, for example phthalic anhydride, tetrahydrophthalic anhydride, hexahydrophthalic anhydride, and pyromellitic dianhydride. In addition it is also possible to use catalytic curing agents, such as cyanoguanidines, or Friedel-Crafts catalysts, such as boron trifluoride.

Where amines are used as curing agents, they are normally employed in an amount of from 0.75 to 1.25 equivalents per epoxide equivalent. In the case of polycarboxylic acids or their anhydrides, from 0.4 to 1.1 equivalents are used per epoxide equivalent.

Particularly suitable accelerators are imidazole derivatives, for example 2-methylimidazole, 2-phenylimidazole and 2-heptadecylimidazole; also suitable are phosphines, metal soaps and acetylacetonates.

Suitable reactive diluents are, for example, mono- or polyfunctional alcohols of low molecular mass which are reacted with epichlorohydrin.

By varying the ratio of equivalents of polyepoxide compound to carboxy-functional phosphinic/phosphonic acid it is possible to adjust the phosphorus content of the novel resin. The ratio of equivalents is preferably between 1:0.1 and 1:0.8 and particularly preferably between 1:0.1 and 1:0.4.

If solvents are employed, then they are aprotic and preferably polar. Examples thereof are: N-methylpyrrolidone, dimethylformamide, ethers, such as diethyl ether, tetrahydrofuran, dioxane, ethylglycol ethers, propylene glycol ethers, butylglycol ethers of monoalcohols having an optionally branched alkyl radical of 1 to 6 carbon atoms.

Examples of other solvents are ketones, such as acetone, methyl ethyl ketone, methyl isopropyl ketone, methyl isobutyl ketone, cyclohexanone and the like, although esters, such as ethyl acetate, butyl acetate, ethylene glycol acetate and methoxypropyl acetate, can also be employed.

Further suitable solvents are halogenated hydrocarbons and also cycloaliphatic and/or aromatic hydrocarbons; among these, preference is given to hexane, heptane, cyclohexane, toluene and dixylenes. It is possible to employ these solvents individually or in a mixture.

The epoxy resin molding compositions are preferably is reinforced by means of glass cloth or glass fibers. The epoxy resin molding compositions can also be treated with fillers such as quartz flour or aluminum oxide hydrate.

The test of fire behavior was carried out in accordance with the directions of Underwriters Laboratories "Test for Flammability of Plastic Materials-UL 94" in the version of 05.02.1975 on test specimens measuring 127 mm in length, 12.7 mm in width and of various thicknesses. The oxygen index was determined in an apparatus in accordance with ASTM-D 2863-74.

The novel epoxy resin molding compositions can be used for surface coating. They can be used for encapsulating electrical components, for laminates and for adhesives.

The invention is illustrated below by means of examples:

EXAMPLE 1

(with 2-carboxyethanemethanephosphinic acid)

200 g of a bisphenol A bisglycidyl ether having an epoxide value of 5.5 mol/kg are charged to a 500 ml five-necked flask with reflux condenser, stirrer shaft, thermometer and solids metering port. At a bath temperature of 100° C., 41 g (0.27 mol) of 2-carboxyethanemethanephosphinic acid are added in portions. After 30 minutes, a clear solution with an epoxide value of 3.1 mol/kg is obtained. After stirring at 100° C. for 4 hours more, an epoxy resin is obtained which is solid at room temperature and has an epoxide value of 2.4 mol/kg and a phosphorus content of 3.5% by weight.

EXAMPLE 2

(with 2-carboxyethanemethanephosphinic acid)

100 g of a bisphenol A bisglycidyl ether having an epoxide value of 5.5 mol/kg are charged to a 500 ml five-necked flask with reflux condenser, stirrer shaft, thermometer and solids metering port. At a bath temperature of 100°C., 30.8 g (0.2 mol) of 2-carboxyethanemethanephosphinic acid are added in portions. After stirring at 100° C. for 2.5 hours more, an epoxy resin is obtained which is solid at room temperature and has an epoxide value of 1.3 mol/kg and a phosphorus content of 4.7% by weight.

EXAMPLE 3

(with 2-carboxyethanemethanephosphinic acid)

842 g of a bisphenol A bisglycidyl ether having an epoxide value of 5.5 mol/kg and 234.8 g of 2-carboxyethanemethanephosphinic acid are charged to a 2 l five-necked flask with reflux condenser, stirrer shaft, thermometer and solids metering port. The mixture is stirred at 95° C. for 1 h. Then 335 ml of methyl ethyl ketone are metered in at 95° C. over the course of 2 h. After stirring for 2 h more, an 80% strength solution of a phosphorus-modified epoxy resin is obtained. The epoxide value is 1.7 mol/kg, the phosphorus content is 3.4% by weight. After storage at room temperature for 12 days, the epoxide value is 1.7 mol/kg.

EXAMPLE 4

(with monomethyl 2-carboxyethanephosphonate)

264 g of a bisphenol A bisglycidyl ether having an epoxide value of 5.5 mol/kg are charged to a 500 ml five-necked flask with reflux condenser, stirrer shaft, thermometer and solids metering port. At a bath temperature of 120° C. under a gentle vacuum (250 mm), 67 g (0.36 mol) of monomethyl 2-carboxyethanephosphonate, dissolved in 50 ml of methyl ethyl ketone, are added over the course of 30 minutes. The solvent is removed by distillation. After stirring at 120° C. for 30 minutes more, 328.7 g of an epoxy resin are obtained which is solid at room temperature and has an epoxide value of 1.3 mol/kg and a phosphorus content of 3.4% by weight.

EXAMPLE 5

(with monoethyl carboxymethanephosphonate)

79 g of a bisphenol A bisglycidyl ether having an epoxide value of 5.5 mol/kg and 20 ml of methyl ethyl ketone are charged to a 250 ml five-necked flask with reflux condenser, stirrer shaft, thermometer and solids metering port. At a bath temperature of 75° C., 18.25 g of monoethyl carboxymethanephosphonate (0.1 mol), dissolved in 15 ml of methyl ethyl ketone, are added over the course of 30 minutes. The solvent is removed by distillation. After stirring at 75° C. for 2 h more, 100.7 g of an epoxy resin are obtained which is solid at room temperature and has an epoxide value of 1.8 mol/kg and a phosphorus content of 3.1% by weight.

EXAMPLE 6

(with 2-carboxyethanephenylphosphinic acid)

103 g of a bisphenol A bisglycidyl ether having an epoxide value of 5.5 mol/kg are charged to a 250 ml five-necked flask with reflux condenser, stirrer shaft, thermometer and solids metering port. At a bath temperature of 120° C., 28 g (0.14 mol) of 2-carboxyethanephenylphosphinic acid are added in portions. After 30 minutes, a clear solution with an epoxide value of 2.7 mol/kg is obtained. After stirring at 120° C. for 30 minutes more, an epoxy resin is obtained which is solid at room temperature and has an epoxide value of 2.5 mol/kg and a phosphorus content of 3.3% by weight.

EXAMPLE 7

(with 2-carboxyethanephenylphosphinic acid)

100 g of a bisphenol A bisglycidyl ether having an epoxide value of 5.5 mol/kg are charged to a 250 ml five-necked flask with reflux condenser, stirrer shaft, thermometer and solids metering port. At a bath temperature of 120° C., 41.1 g (0.2 mol) of 2-carboxyethanephenylphosphinic acid are added in portions. After 30 minutes, a clear solution is obtained. After stirring at 120° C. for 30 minutes more, an epoxy resin is obtained which is solid at room temperature and has an epoxide value of 1.5 mol/kg and a phosphorus content of 4.5% by weight.

We claim:

1. A process for preparing soluble and/or meltable, phosphorous-modified epoxy resins, which comprises reacting a polyepoxide compound having at least 2 epoxide groups per molecule with carboxyl-containing phosphinic or phosphonic acids of the formula (I) or (II)

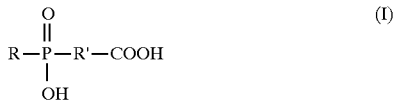

in which R is a linear or branched alkyl, cycloalkyl, aryl or alkylaryl group having 1 to 18 carbon atoms or is hydrogen, R' is a linear or branched alkylene, cycloalkylene or alkylarylene group having 1 to 18 carbon atoms and R" is a linear or branched alkyl, cycloalkyl, aryl or alkylaryl group having 1 to 18 carbon atoms.

2. A process for preparing soluble and/or meltable, phosphorous-modified epoxy resins, which comprises reacting a polyepoxide compound having at least 2 epoxide groups per molecule with carboxylic acid group-containing phosphinic or phosphonic acids of the formula (I) or (II)

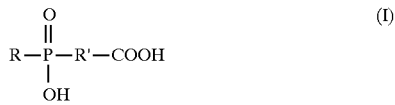

in which R is a linear or branched alkyl, cycloalkyl, aryl or alkyaryl group having 1 to 6 carbon atoms and R' is a linear or branched alkylene or cycloalkylene, alkylarylene group having 1 to 18 carbon atoms.

3. The process as claimed in claim 1, wherein R' is a linear or branched alkylene, cycloalkylene or arylene group having 1 to 6 carbon atoms.

4. The process as claimed in claim 1, wherein the phosphinic acid employed is 2-carboxyethanemethanephosphinic acid.

5. The process as claimed in claim 1, wherein the phosphinic acid employed is 2-carboxyethanephenylphosphinic acid.

6. The process as claimed in claim 1, wherein the phosphinic acid employed is 2-carboxymethylmethanephosphinic acid.

7. The process as claimed in claim 1, wherein the phosphonic acid employed is monomethyl-2-carboxyethanephosphonate.

8. The process as claimed in claim 1, wherein the phosphonic acid employed is monoethyl carboxymethylphosphonate.

9. The process as claimed in claim 1, wherein R' is an alkylene group having 1 or 2 carbon atoms.

10. The process as claimed in claim 1, wherein the reaction takes place in a solvent.

11. The process as claimed in claim 10, wherein said solvent is a aprotic polar solvent selected from the group consisting of N-methylpyrrolidone, dimethylformamide, tetrahydrofuran, dioxane, dialkyl-ethers, glycol ethers, ketones, and esters.

12. The process as claimed in claim 10, wherein said solvent is selected from the group consisting of halogenated hydrocarbons, aliphatic, cycloaliphatic and aromatic hydrocarbons, mixtures thereof.

13. The process as claimed in claim 1, wherein the reaction takes place at temperatures from 20° to 150° C.

14. The process as claimed in claim 1, wherein the ratio of equivalents between polyepoxide compound and carboxyl-containing phosphinic or phosphonic acid is from 1:0.1 to 1:0.8.

* * * * *